(12) United States Patent
Pham et al.

(10) Patent No.: US 7,271,019 B1
(45) Date of Patent: Sep. 18, 2007

(54) LATERAL HEAT SPREADING LAYERS FOR EPI-SIDE UP RIDGE WAVEGUIDE SEMICONDUCTOR LASERS

(75) Inventors: John T. Pham, Fairfax, VA (US); John D. Bruno, Bowie, MD (US); Richard L. Tober, Elkridge, MD (US)

(73) Assignee: United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 11/452,566

(22) Filed: Jun. 9, 2006

Related U.S. Application Data (62) Division of application No. 10/927,653, filed on Aug. 24, 2004, now Pat. No. 7,061,022.

(60) Provisional application No. 60/499,064, filed on Aug. 26, 2003.

(51) Int. Cl.
*H01L 21/00* (2006.01)
(52) U.S. Cl. .............................. 438/22; 438/31; 438/39; 257/E21.366
(58) Field of Classification Search .................. 438/31, 438/39, 678, 22; 257/E21.366
See application file for complete search history.

(56) References Cited

U.S. PATENT DOCUMENTS

| | | | |
|---|---|---|---|
| 4,799,543 A | 1/1989 | Iversen et al. | |
| 5,654,228 A * | 8/1997 | Shieh et al. | 438/32 |
| 5,847,452 A | 12/1998 | Tantoush | |
| 6,046,503 A | 4/2000 | Weigand et al. | |
| 6,051,871 A * | 4/2000 | DeLaCruz et al. | 257/571 |
| 6,154,364 A | 11/2000 | Girrens et al. | |
| 6,209,623 B1 | 4/2001 | Tantoush | |
| 6,281,030 B1 * | 8/2001 | Shimizu | 438/31 |

(Continued)

OTHER PUBLICATIONS

Wipiejewski, T., et al., Size-Dependent Output Power Saturation of Vertical-Cavity Surface-Emitting Laser Diodes, IEEE Photonics Technology Letters, vol. 8, No. 1, Jan. 1996, pp. 10-12.*

(Continued)

*Primary Examiner*—T. N. Quach
(74) *Attorney, Agent, or Firm*—Edward L. Stolarun (57) ABSTRACT

Disclosed are a semiconductor device and method of manufacturing the same comprising a substrate, a mesa region adjacent to the substrate, an electroplated metal layer, for reducing the thermal resistance of the device, surrounding the mesa region, an insulator layer separating a side portion of the mesa region from the electroplated metal layer, a heat sink, a bonding layer adjacent to the heat sink, and a second metal layer in between the substrate and the heat sink, wherein the substrate is adjacent to the bonding layer, and wherein the electroplated metal layer dimensioned and configured to have a thickness of at least half a thickness of the mesa region; and to laterally spread heat away from the mesa region. The mesa region comprises a first cladding layer adjacent to the substrate, an active region adjacent the first cladding layer, and a second cladding layer adjacent to the active region.

8 Claims, 7 Drawing Sheets

U.S. PATENT DOCUMENTS

| | | | |
|---|---|---|---|
| 6,335,863 B1 | 1/2002 | Yamamoto et al. | |
| 6,586,279 B1 | 7/2003 | Davidson et al. | |
| 6,653,158 B2 * | 11/2003 | Hall et al. | 438/22 |
| 6,711,191 B1 * | 3/2004 | Kozaki et al. | 372/43.01 |
| 2002/0070390 A1 * | 6/2002 | Chow | 257/197 |
| 2003/0116851 A1 * | 6/2003 | Sett et al. | 257/758 |
| 2004/0252739 A1 * | 12/2004 | Takeuchi et al. | 372/46 |

OTHER PUBLICATIONS

Wipiejewski, T., et al., Improved Performance of Vertical-Cavity Surface-Emitting Laser Diodes with Au-Plated Heat Spreading Layer, IEEE Electronics Letters, vol. 31, No. 4, Feb. 16, 1995, pp. 279-281.*

Yu, J. et al., "Very High Average Power at Room Temperature From $\lambda \approx 5.9$-μm Quantum-Cascade Lasers," Applied Physics Letters, vol. 82, No. 20, May 19, 2003, pp. 3397-3399.

* cited by examiner

LATERAL HEAT SPREADING LAYERS FOR EPI-SIDE UP RIDGE WAVEGUIDE SEMICONDUCTOR LASERS

CROSS-REFERENCE TO RELATED APPLICATION

This application is a Divisional of application Ser. No. 10/927,653 filed Aug. 24, 2004, U.S. Pat. No. 7,061,022, which claims the benefit of U.S. Provisional Patent Application No. 60/499,064 filed Aug. 26, 2003, the complete disclosure of which is herein incorporated by reference.

GOVERNMENT INTEREST

The invention described herein may be manufactured, used, and/or licensed by or for the United States Government.

BACKGROUND OF THE INVENTION

1. Field of the Invention

The invention generally relates to heat dissipation layers for semiconductor devices, and more particularly to a semiconductor device with a metal layer above and beyond the region confined by the optical mode of a semiconductor laser which effectively transports heat away from that region and into the heat sink.

2. Description of the Related Art

Within this application several publications are referenced by Arabic numerals within brackets. Full citations for these publications may be found at the end of the specification immediately preceding the claims. The disclosures of all these publications in their entireties are hereby expressly incorporated by reference into the present application for the purposes of indicating the background of the invention and illustrating the general state of the art.

During semiconductor laser continuous-wave (cw) operation, significant heat generation occurs within the active region of the semiconductor device. These devices are typically mounted onto temperature-controlled heat sinks to keep them from heating past their maximum operating temperature. Thermal coupling efficiency between the semiconductor laser structure and heat sink plays a significant role in determining the maximum operating temperature of a semiconductor laser (as measured at the heat sink). The technique of mounting the laser epi-side down on a heat sink has conventionally been the most effective method of heat removal in these devices. However, the epi-side down process is more complicated and has a significantly lower yield than the epi-side up process. Therefore, the epi-side up process is the preferred technique for manufacturing these semiconductor devices.

Ridge waveguide semiconductor lasers employ etching techniques to define mesa structures. These mesas improve laser performance by confining injected carriers and optical modes to the same region of space. The mesa is typically etched down through the laser structure's active region or even partially down through the lower cladding region.

Mid-wave (3-5 µm) and long-wave (8-12 µm) infrared (IR) semiconductor diode lasers (SDLs) are needed as sources for several civilian and military applications. These include local and remote chemical sensing, free-space optical communications, IR countermeasures, and IR ladars. For most applications, lasers are required that can operate under cw (or quasi-cw) conditions at ambient temperatures or at temperatures (T) accessible to thermoelectric coolers (T>approximately 240 K).

Despite the huge variety of commercially available SDLs emitting in the near-IR spectral region ($\lambda$<approximately 1.6 µm), the options available at longer wavelengths (greater than approximately 2 µm) are few, usually unsatisfactory, and progressively worse as the wavelength increases. The technical reason for this circumstance is related to the reduced photon energy and the wavelength dependence of various loss and recombination mechanisms in SDLs. Until recently, there seemed to be little hope for significant increases in the cw operating temperatures of SDLs emitting at wavelengths greater than approximately 3 µm.

This circumstance changed with the demonstration of the quantum cascade (QC) laser[1] and the type-II interband cascade (IC) laser[2]. Both of these devices use multi-layered III-V semiconductor structures that provide for electronic states between which lasing can occur with emission, in principle, at any wavelength greater than approximately 2.5 µm (IC) and approximately 3.5 µm (QC). Using band-gap engineering, they can be designed in ways that substantially reduce the significance of mechanisms (including Auger recombination) that plague more conventional SDLs. Moreover, the active regions of these lasers are cascaded in series allowing for a more effective use of applied bias. This leads to quantum efficiencies that can exceed the conventional limit of unity. Both of these attributes have led to the demonstration of improved power conversion efficiencies at the longer wavelengths compared with more conventional SDLs, and to date, encouraging results have been obtained using both designs. Examples of both the QC lasers and IC lasers are well known in the semiconductor industry[3].

An important additional advantage of the IC design is its use of active regions that rely on interband optical transitions (rather than the intersubband transitions used in the QC laser). This leads to higher radiative efficiencies and significantly reduced threshold currents. Calculations have predicted that IC lasers should be capable of operating under cw conditions up to room temperature with high output power[4].

Since its first demonstration, IC laser performance has advanced considerably. Experimental work with these devices has led to IC lasers that have demonstrated high differential external quantum efficiency (>600%) and high peak output power (approximately 6 W/facet at 80 K)[3]. In other conventional designs, high cw wall plug efficiency (>17% at 80 K) and operation at 300 K under pulsed conditions have been obtained[5].

Despite the achievement of lasing at 300 K, significant issues limiting high-temperature performance remain. Principal among these are the rapid increase of non-radiative processes with increasing active-region temperature (e.g., Auger processes) and the large accumulation of heat in the laser's active region at increased operating temperatures. The latter effect leads to a significant temperature offset, $\Delta T$, between the heat sink and active region temperatures under cw conditions. For example, in the IC laser that operated at 300 K under pulsed conditions, the maximum cw heat sink temperature was limited to approximately 150 K. This suggests that $\Delta T$ can be quite large. The active/injection regions of this device are surrounded by short period AlSb/InAs strained layer superlattice (SLS) regions that form cladding layers required to confine the laser's optical mode. These SLS regions consist of many interfaces (often>700) that impede the flow of heat out of the laser's core region, and they are partly responsible for a large $\Delta T$.

For most diode lasers, including IC lasers, the behavior of the threshold current density $J_{th}$ with active region temperature $T_a$ follows the empirical relation $J_{th}=J_0 \exp(T_a/T_0)$, where $J_0$ and $T_0$ are fitting parameters. The heat sink temperature $T_h$ is related to $T_a$ by $T_a=T_h+RIV$, where R is the device thermal resistance and V and I are the device's cw voltage and current, respectively. Here it is assumed that all dissipated energy goes into heat. One can combine these results to determine, for a given value of the thermal resistance R, the maximum heat sink temperature at which the device will operate under cw conditions[6].

This leads to $T_h^{max}=T_0[Ln(T_0/R_{sp}V_{th}J_0))-1]$, where $V_{th}$ is the threshold voltage across the device at the maximum cw operating temperature, and $R_{sp}$ is the specific thermal resistance of the device defined by the product of R with A, the device's active region area (cavity length×mesa width). Examination of this expression shows that the maximum temperature of cw operation can be increased by raising $T_0$, the laser's characteristic temperature, and/or by lowering $R_{sp}$, $J_0$, and/or $V_{th}$. These representations are equally valid when applied to the QC laser or any mid-wave or long-wave semiconductor laser where heat removal is essential because of the higher losses that plague the performance of semiconductor lasers at the longer wavelengths.

Figure 1:
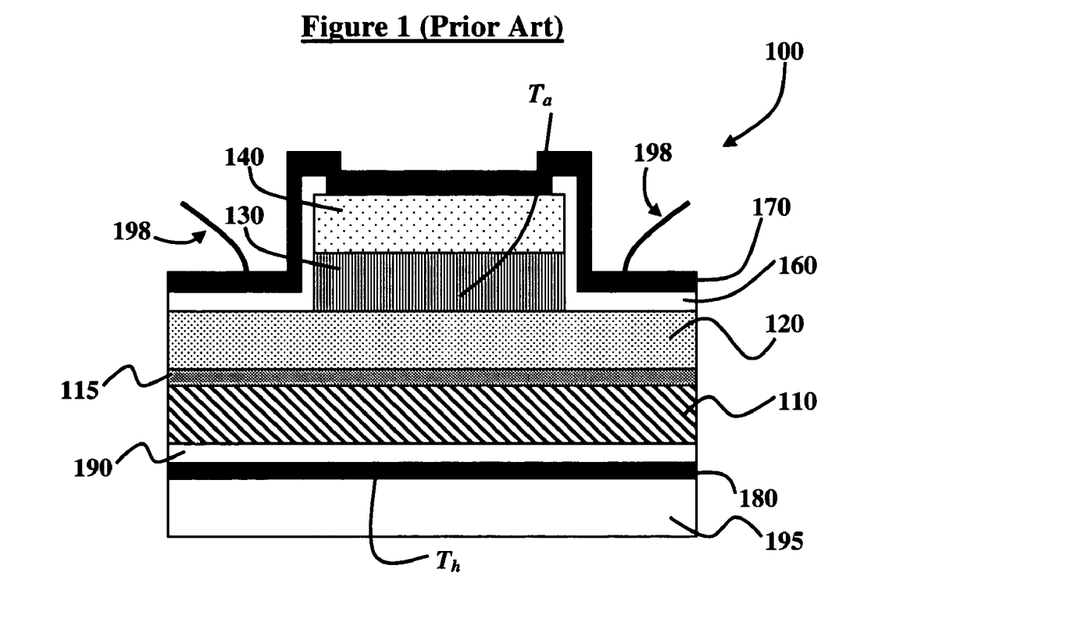
FIG. 1 is a cross-sectional view of a conventional epi-side up semiconductor device.

FIG. 1 shows the typical cross-section of a conventional device 100 consisting of the IC laser's cascaded active/injection region 130 (or core region) sandwiched between SLS optical cladding regions (with typical thicknesses shown in FIG. 4) 120, 140. In the conventional device 100, the mesa (active region 130 and upper and lower cladding regions 140, 120, respectively) is defined by etching down through the core region 130 to the top of the lower cladding 120. The conventional sample 100 is then covered with a thin electrically insulating layer 160 of $SiO_2$ (or some other typical dielectric material) with a window left open on top of the mesa for electrical contact. The device processing is completed with the evaporation of an Au/Ti (or similar) contact layer 170, 180 on the bottom of the substrate 110 (separated by a bonding layer 190) and on top of the conventional sample 100 extending beyond both sides of the mesa 130 above the insulating $SiO_2$ layer 160. This Au/Ti contact layer 170 rarely exceeds approximately 0.5 µm in thickness, and the mesa 130 is typically approximately 15 µm wide but can range in width between approximately 2 µm to several hundred microns.

The conventional sample 100 is then cleaved and soldered (with uncoated facets, epi-side-up) onto a Cu heat sink 195, and wires 198 are bonded to the metal contact 170. As is evident in FIGS. 1 and 4, the active region 130 is separated from the heat sink 195 by approximately 80-90 µm of a GaSb substrate 110 and approximately 2-3 µm of the SLS cladding layer 120. The substrate 110, which includes a buffer layer 115, has a thermal conductivity of approximately 33 W/m K while the lower cladding material's 120 thermal conductivity is approximately 3.6 W/m K[7].

However, the conventional designs do not adequately lower the thermal resistance to optimal levels. Therefore, there is a need for a new and improved semiconductor device to decrease the thermal resistance of IC lasers mounted in a conventional epi-side-up configuration.

SUMMARY OF INVENTION

In view of the foregoing, an embodiment of the invention provides a semiconductor device comprising a substrate, a mesa region adjacent the substrate, an electroplated (or otherwise-deposited) metal layer surrounding the mesa region, and an insulator layer separating a side portion of the mesa region from the electroplated metal layer, wherein the electroplated metal layer is dimensioned and configured to have a thickness of at least half a thickness of the mesa region; and to laterally spread heat away from the mesa region. Moreover, the mesa region (or semiconductor region) comprises a first cladding layer adjacent to the substrate, an active region adjacent to the first cladding layer, and a second cladding layer adjacent to the active region. The semiconductor device further comprises a heat sink and a bonding layer adjacent to the heat sink, wherein the substrate is adjacent to the bonding layer. According to the invention, the electroplated (or otherwise-deposited) metal layer reduces the thermal resistance of the semiconductor device and the insulator layer partially separates an upper portion of the mesa region from the electroplated metal layer. Also, the electroplated metal layer comprises gold and is at least 3 microns thick. Additionally, the semiconductor device further comprises an evaporated metal layer in between the substrate and the heat sink. Furthermore, the semiconductor device comprises an operating temperature of greater than 200 K.

In another embodiment, the invention provides a method of manufacturing a semiconductor device, wherein the method comprises depositing a first cladding layer adjacent to a substrate, depositing an active region adjacent to the first cladding layer, depositing a second cladding layer adjacent to the active region, depositing an insulator layer around a side portion of the first cladding layer, the active region, and the second cladding layer, and electroplating a metal layer adjacent the insulator layer, wherein the electroplated metal layer is dimensioned and configured to have a thickness of at least half a thickness of the active region; and to laterally spread heat away from the semiconductor active region. The method further comprises forming a bonding layer adjacent to the substrate, forming a heat sink adjacent to the bonding layer, and evaporating a second metal layer in between the substrate and the heat sink.

As such, the invention discloses a means for reducing the semiconductor device thermal resistance and consequently the difference in temperature between the device active region and the heat sink. Moreover, the invention can be applied to a QC laser or other semiconductor laser and significant improvements in device performance will result. Moreover, the invention achieves significant reductions in thermal resistance (averaging 25 K/W or 40% for 1 mm long devices), 80 K cw operation at 3.4 µm with high-power conversion efficiency (23%) and high differential external quantum efficiency (532%), and cw operation up to 214 K.

These, and other aspects and advantages of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the invention without departing from the spirit thereof, and the invention includes all such modifications.

BRIEF DESCRIPTION OF THE DRAWINGS

The invention will be better understood from the following detailed description of the preferred embodiments of the invention with reference to the drawings, in which.

DETAILED DESCRIPTION OF PREFERRED EMBODIMENTS OF THE INVENTION

The invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the invention. The examples used herein are intended merely to facilitate an understanding of ways in which the invention may be practiced and to further enable those of skill in the art to practice the invention. Accordingly, the examples should not be construed as limiting the scope of the invention.

Figure 2:
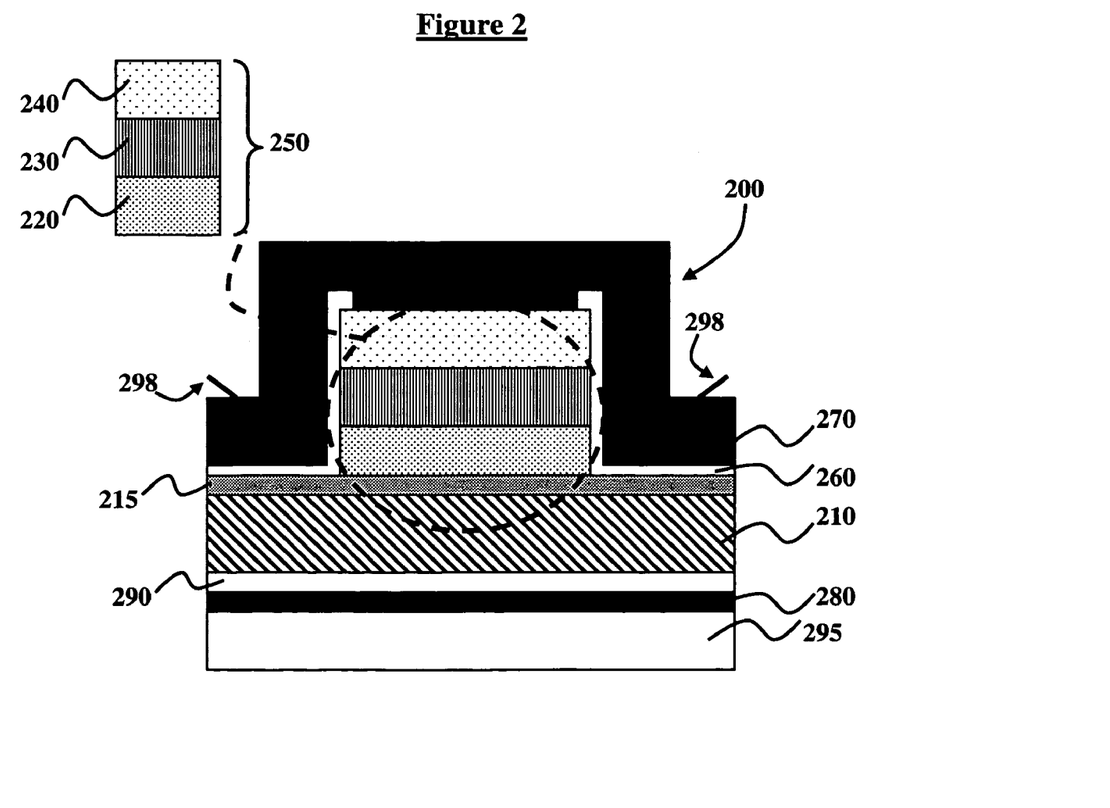
FIG. 2 is a cross-sectional view of an epi-side up semiconductor device according to the invention.

As previously mentioned, there is a need for a new and improved semiconductor device to decrease the thermal resistance of IC lasers mounted in a conventional epi-side-up configuration. The invention provides a semiconductor device 200 manufactured by beginning with a p-type GaSb substrate 210 comprising a buffer layer 215. Then, an n-InAs/AlSb SLS first cladding layer 220 is deposited over the buffer layer 215. Next, an active/injection region (core region) 230 is deposited over the first cladding layer 220. Thereafter, an n-InAs/AlSb SLS second cladding layer 240 is deposited over the active region 230. Next, an etching step occurs whereby portions of the first cladding layer 220, the active region 230, and the second cladding layer 240 are removed to create a defined mesa region 250.

Then, an insulator layer 260 is deposited over the mesa region 250. Next, an Au/Ti metal contact layer (not shown) is evaporated over the insulator layer 260. This metal contact layer becomes a thicker electroplated metal layer 270 upon the deposition of extra metal (preferably gold) over the device 200. Also, an evaporated metal contact layer 280 is applied to the underside of the substrate 210. Next, a bonding layer 290 (eg. indium) is applied to the evaporated metal contact layer 280. Finally, a heat sink 295 (eg. copper, CVD diamond, or other suitable electrical insulating materials) is applied adjacent to the bonding layer 290. Wire connectors 298 are also attached to the metal contact 270. The completed device 200 is illustrated in FIG. 2.

Moreover, the invention achieves significant reductions in thermal resistance (averaging 25 K/W or 40% for 1 mm long devices), 80 K cw operation at 3.4 µm with high-power conversion efficiency (23%) and high differential external quantum efficiency (532%), and cw operation up to 214 K.

Figure 3:
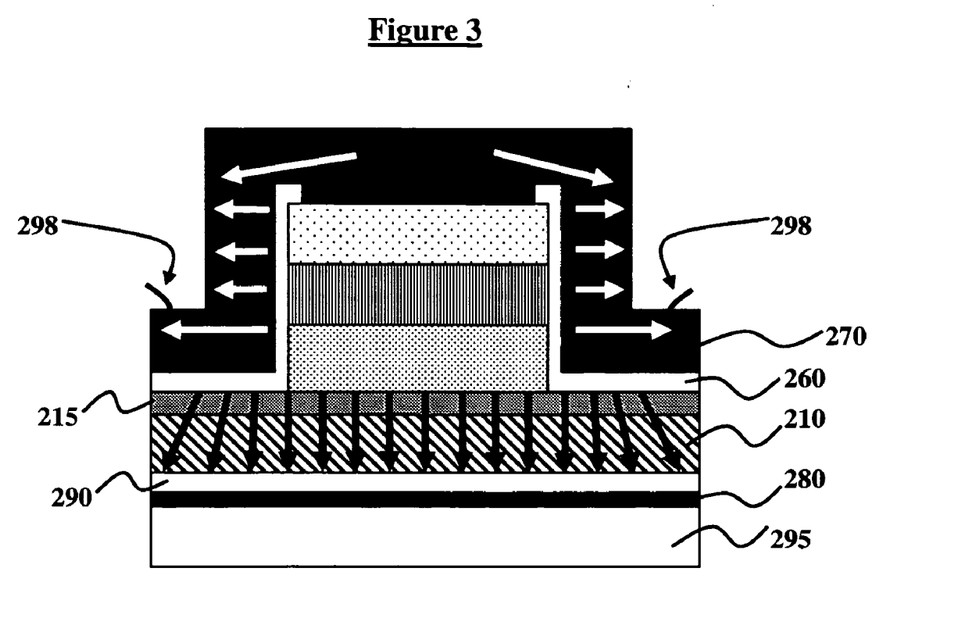
FIG. 3 is a cross-sectional view of a completed epi-side up semiconductor device showing the flow of heat according to the invention.

Essentially, in order to reduce the thermal resistance of a semiconductor device, the invention performs the following steps. First, in a preferred embodiment the etching used to define the mesa region 250 is continued down through the lower SLS cladding material 220. However, the mesa device 250 does not have to be defined by deep etching. Rather, narrow trenches, which are well known in the art, can be used to define the mesa (laser) 250. Next, after the Au/Ti contact is evaporated onto the device 200, the metal contact is used as an electrode to electroplate (EP) 3 µm of additional gold over the sample's top contact layer 240. In other words, the electroplated metal layer 270 is dimensioned to have a thickness of at least half a thickness of the mesa region 220. While the preferred thickness of the electroplated metal layer 270 is 3 µm, any thickness over 2 µm can be used. The device 200 provided by the invention is shown in FIG. 3 with arrows depicting the flow of heat way from the device's active region 230 illustrating the expected advantage of the invention's fabrication method. The idea is to move heat away from the active region 230 through the top and sides of the mesa region 250 and into the highly conducting EP Au layer 270 so that it can conduct away from the mesa 250 and down through the substrate 210 over a wider area than is provided by the conventional devices. Additionally, by removing larger sections of the lower cladding layer 220, the heat does not have to flow through the low-conductivity cladding, thereby resulting in increased heat flow out of the device 200.

Figure 4:
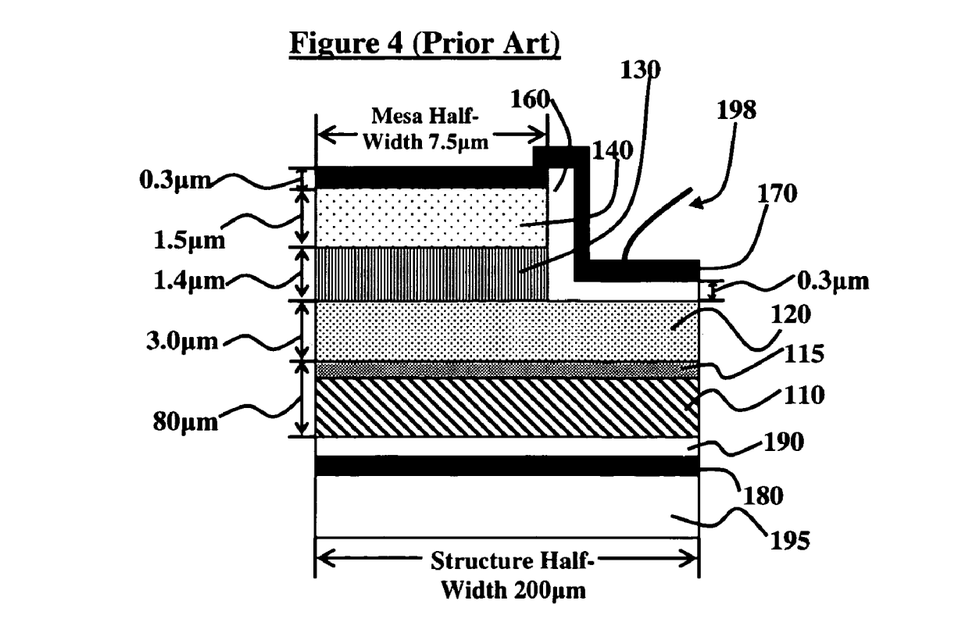
FIG. 4 is a cross-sectional view of a conventional epi-side up semiconductor device used as a basis for thermal modeling according to the invention.

In order to test the validity of the invention, thermal modeling was performed on structures representing the conventional methods as well as the method provided by the invention. FIG. 4 shows the cross-sectional geometry used for the thermal modeling of the conventional device structures. Only half of the 15 µm wide mesa chosen for the modeling is shown for ease of understanding. The thermal conductivities used in the modeling[7] were Au: 317; $SiO_2$: 1.4; SLS cladding: 3.6; active/injection region: 4.0; GaSb substrate: 33; Indium (In) solder: 82; and Cu heat sink: 400, all measured in W/m K. The steady-state heat equation was solved for the temperature contours throughout the device structure assuming an applied bias of 7.0V (reasonable for an 18 cascade device emitting near 3.4 µm) and a current density of 300 $A/cm^2$ (corresponding to approximately twenty-five times the 80 K threshold current density for such devices). All of the applied power was dissipated as heat uniformly throughout the laser's active/injection region. The heat sink was maintained at a fixed temperature, and heat flow was maintained continuously across material interfaces and forced to zero along the device's vertical centerline (by symmetry) and along external boundaries of the mesa and contact layers.

Figure 5:
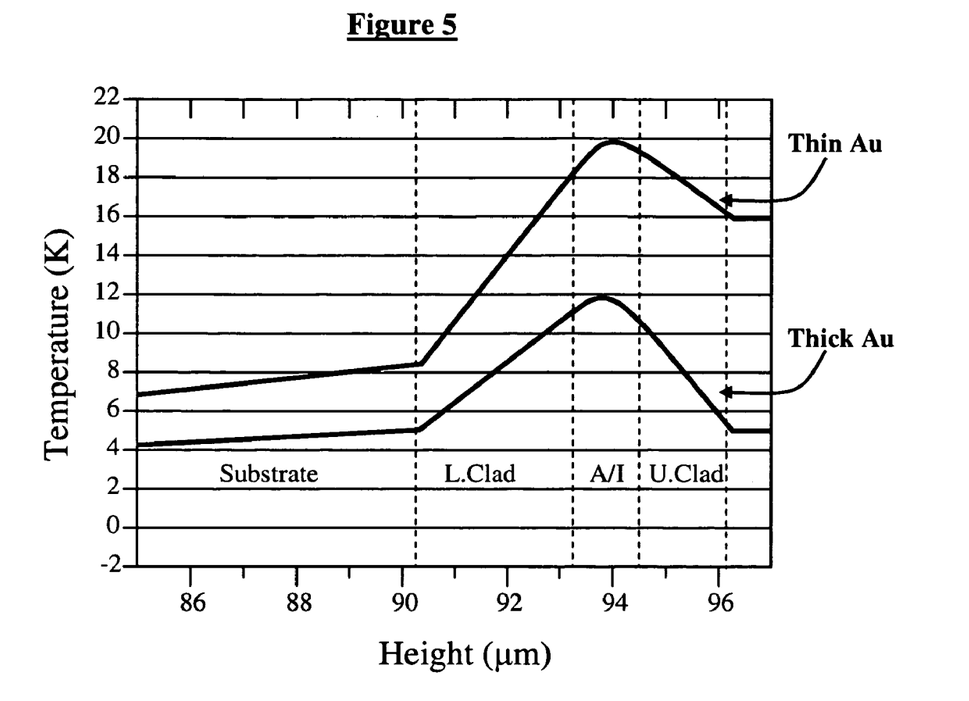
FIG. 5 is a graphical illustration comparing the temperature difference as a function of the height of a conventional device and a device according to the invention.

FIG. 5 shows temperature profiles (relative to the heat sink temperature) obtained from the thermal modeling. The temperature differences are plotted as a function of position along the vertical centerline passing through the device from just below the lower cladding through the upper cladding (along the left edge of FIG. 4). Results are given for both the conventional (upper curve) and invention's (lower curve) fabrication methods. The horizontal axis is in microns, measured from the heat sink position. As shown, the results predict a significant improvement in temperature performance deriving from the invention's fabrication method and design. In particular, the maximum difference in temperature between the heat sink and the active region drops from 19.8 to 11.8 K. This corresponds to a reduction by approximately 25 K/W in thermal resistance from 62.9 to 37.5 K/W for a 1 mm long cavity length device, which leads to a significant performance improvement for such devices.

Figure 6:
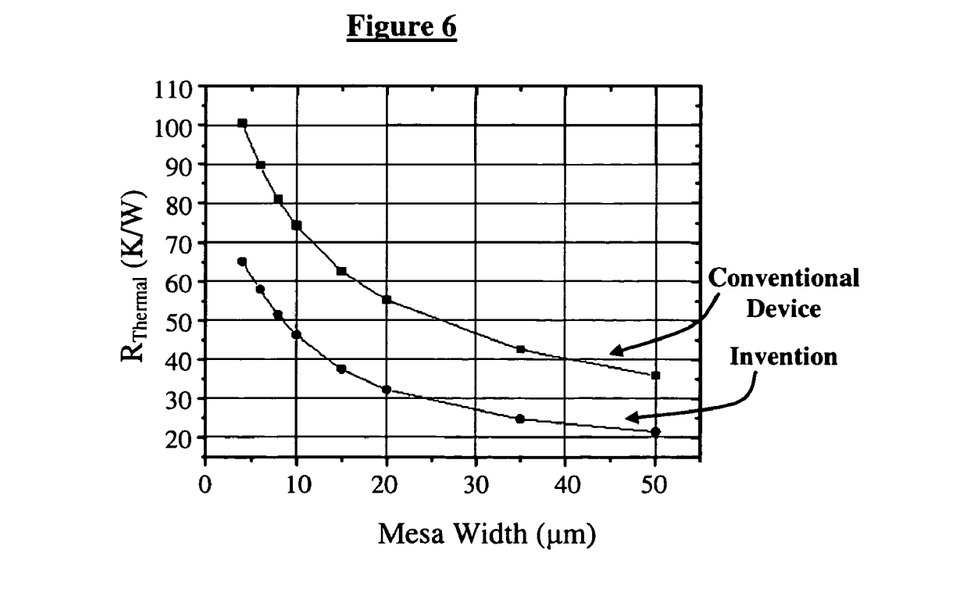
FIG. 6 is a graphical illustration comparing the thermal resistance as a function of the mesa width of a conventional device and a device according to the invention.

In addition to these results, the merits of several other fabrication details were assessed using the thermal modeling. For example, FIG. 6 shows the predicted reduction in thermal resistance between the conventional (upper curve) and invention's (lower curve) fabrication methods as a function of mesa width. The relative thermal advantage of the invention's fabrication method is roughly independent of mesa width; the ratio of the new (invention) to old (conventional) thermal resistance drops from 65% to 60% between mesa widths of 4 and 50 μm.

Figure 7:
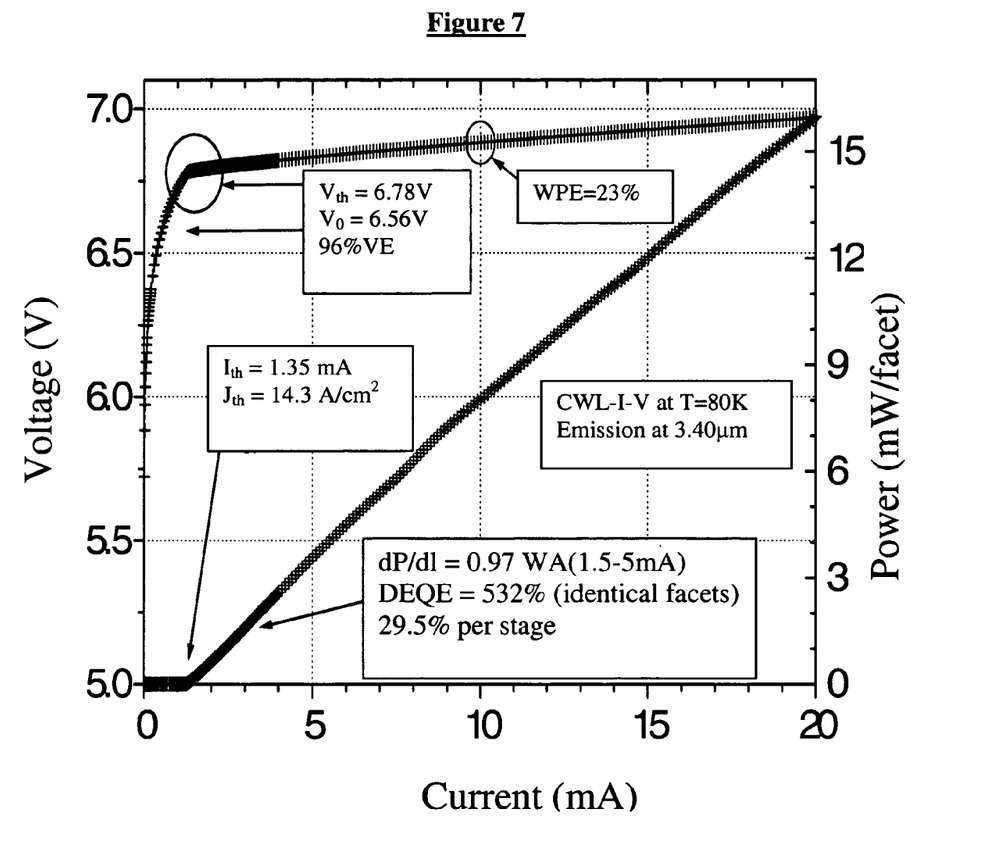
FIG. 7 is a graphical illustration of the L-I-V characteristics of a conventional device.

In order to test the model predictions, an IC laser sample, designated as "M84", is grown by molecular beam epitaxy (MBE) on a p-type GaSb substrate using well known techniques[8] and using 18 cascaded stages similar to a other designs previously described[5]. Next, mesa devices are fabricated according to the conventional methods. FIG. 7 shows the 80 K, L-I-V characteristics for a shallow etched, thin Au contact device (conventional device) that emits at 3.4 μm. The performance is shown with a low threshold current of 1.35 mA (corresponding to a threshold current density of 14.3 A/cm$^2$). Initial slope efficiency (calculated between 1.5 and 5.0 mA) equals 0.97 W/A. Assuming that both facets emit the same power, this corresponds to a differential external quantum efficiency of 532%; i.e., above threshold, approximately 5.3 photons (approximately 0.3 per stage) are emitted for each additional injected electron. The slope efficiency, averages between the threshold current and 20 mA, remains high at 0.86 W/A, and the device emits 16 mW of optical power from a single facet at 20 mA of current with no sign of saturation at the currents measured. The kink in the I-V characteristic (circled), where the differential resistance drops precipitously, signals the onset of lasing and occurs at a bias of 6.78 V. The theoretical value, when all cascades line up, is equal to 18×(hc/λ). This gives a turn-on voltage of 6.56V, leaving a small wasted voltage of 0.22V or voltage efficiency near 96%. At 10 mA of injection current, the power conversion efficiency peaks at 23% (again assuming identical facets).

Figure 8:
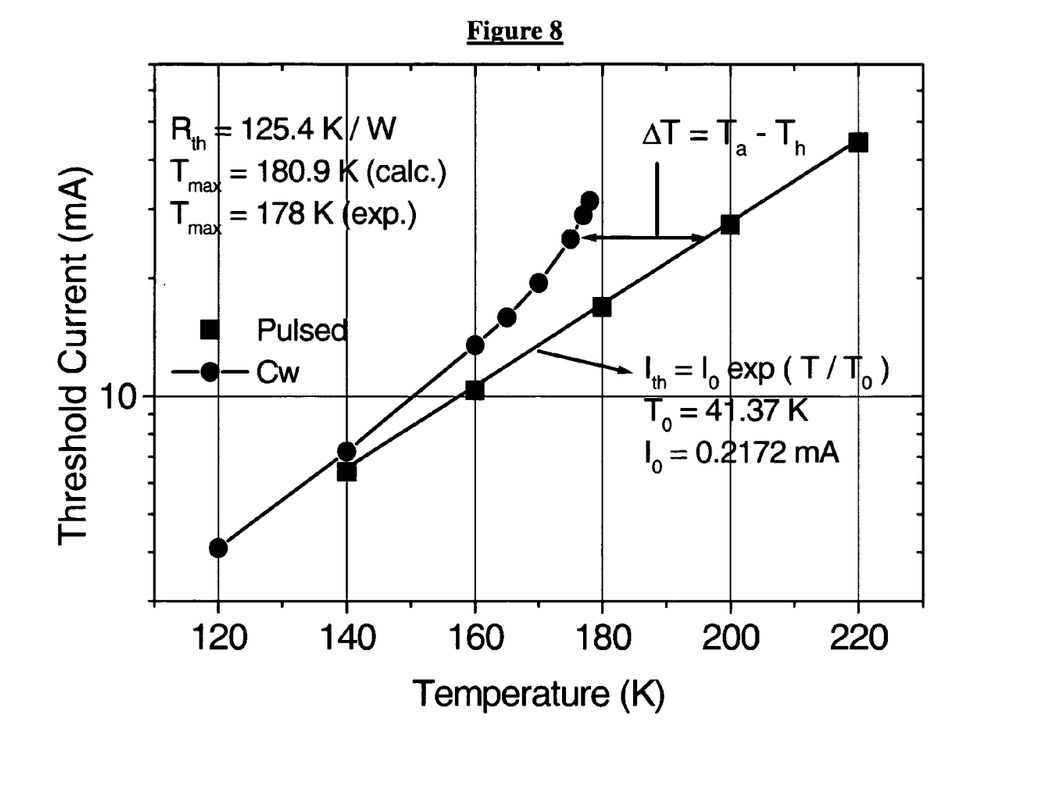
FIG. 8 is a graphical illustration of the temperature dependence of a conventional device.

In order to assess the conventional device's thermal characteristics, pulsed and cw L-I data is taken at a sequence of heat sink temperatures, and threshold currents are determined. FIG. 8 shows the results of these measurements. The pulsed threshold current data fit the empirical relation given earlier while the cw data cannot fit to a straight line. The deviation from the straight-line fit signifies that the active region temperature exceeds the heat sink temperature. The data also shows that this temperature difference increases with increasing heat sink temperature as expected. Assuming that the active region temperature $T_a$ determines the threshold current density uniquely, a measure of $\Delta T = T_a - T_h$ (see FIG. 8) at a given heat sink temperature allows for a determination of the thermal resistance R; $\Delta T$ is divided by the product of the current and voltage at the same heat sink temperature. This leads to a resistance for this device of 125.4 K/W. Using this data in the formula for the maximum cw operating temperature, leads to 180.9 K, in good agreement with the measured value of 178 K for the conventional device.

Similar data were taken for 15 other devices falling into two general classes: those fabricated using the conventional method (12 devices with a shallow etch and 3 a thin Au contact) and those fabricated with the inventive method (four devices with a deep etch and a thick EP Au contact). The shallow etch class includes devices with three cavity lengths (nominally equal to 2, 1, and 0.5 mm, respectively), and the deep etch class includes only devices with 1 mm long cavity lengths. The data from these tests containing the inventive fabrication devices all show thermal resistance values between 10 and 25 K/W lower than that of any similar width conventionally fabricated device with the reduction averaging at approximately 25 K/W or approximately 40% for all devices (appropriately scaled for cavity length). Moreover, all tested devices fabricated according to the invention operate at higher cw operating temperatures than conventionally fabricated devices of the same width.

Figure 9:
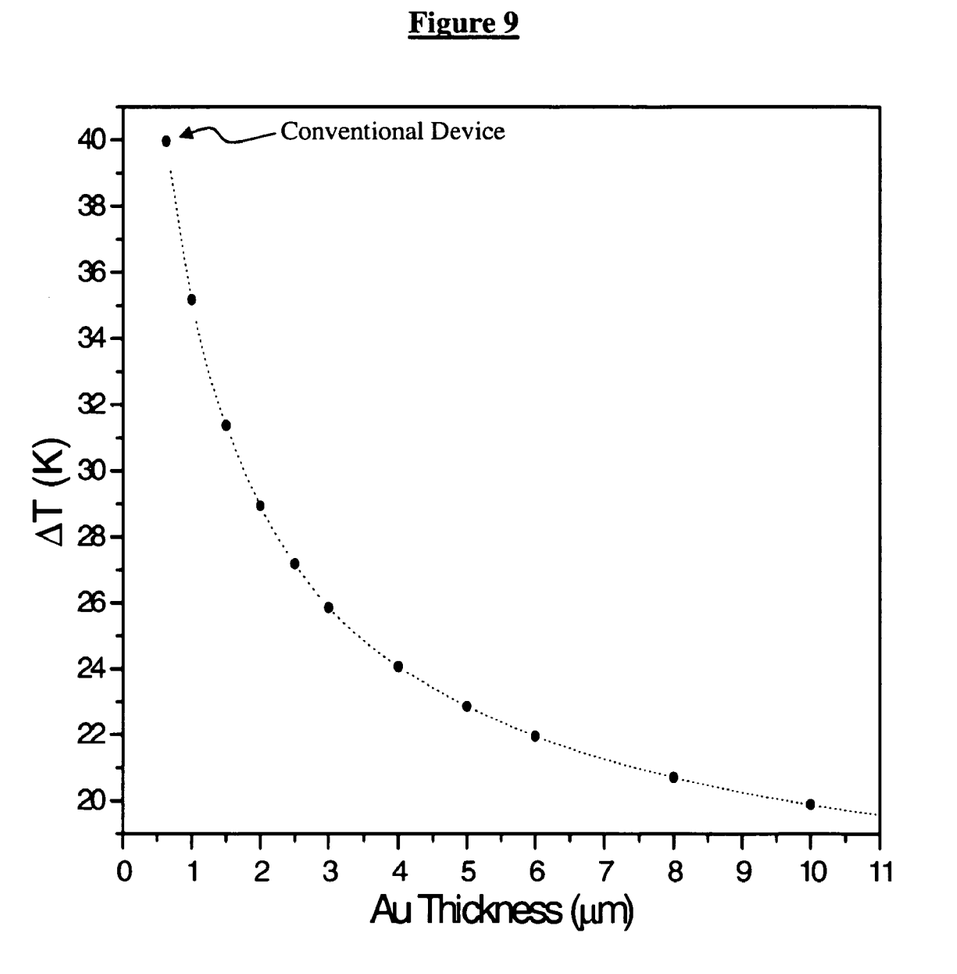
FIG. 9 is a graphical illustration of the thermal performance of a device according to the invention.

FIG. 9 illustrates the improvement in thermal performance of an epi-side-up ridge laser with a thick metal overlayer as provided by the invention. The temperature rise (ΔT) of the active region 230 relative to the heat sink 295 is shown for varying thicknesses of the additional metal layer 270, which preferably comprises gold. The effect is clear, wherein there is a significant reduction in ΔT, or equivalently in the thermal resistance of the device 200, with increasing gold layer 270 thicknesses. This improvement occurs regardless of the specific fabrication process of the additional layer 270.

Figure 10:
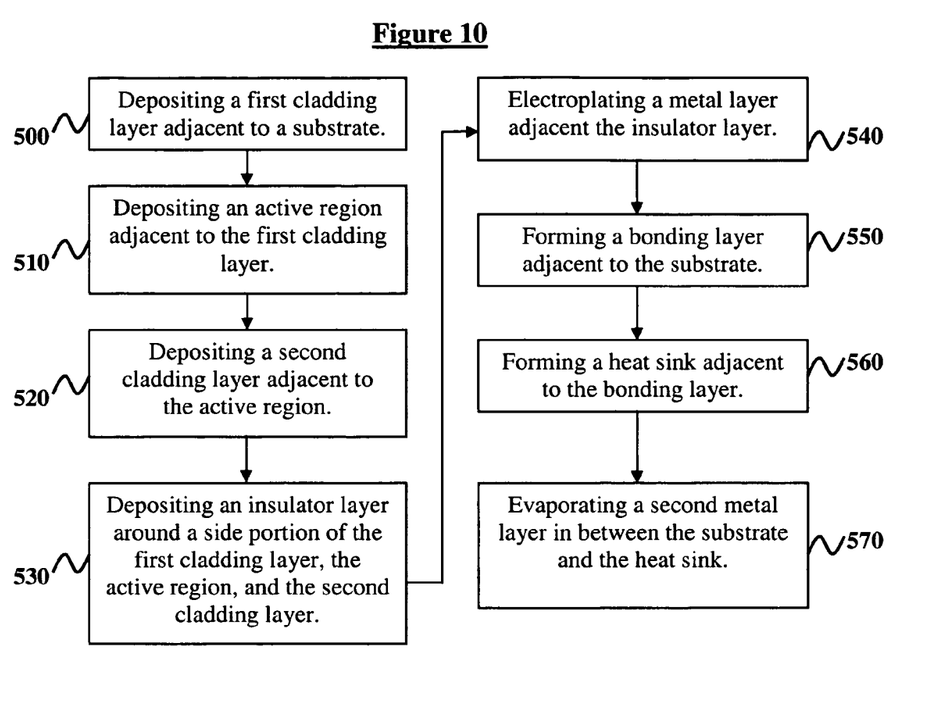
FIG. 10 is a flow diagram illustrating a preferred method of the invention.

As mentioned, the invention provides a method of manufacturing a semiconductor device 200, wherein the method, shown in the flow diagram of FIG. 10, comprises depositing 500 a first cladding layer 220 adjacent to a substrate 210, depositing 510 an active region 230 adjacent to the first cladding layer 220, depositing 520 a second cladding layer 240 adjacent to the active region 230, depositing 530 an insulator layer 260 around a side portion of the first cladding layer 220, the active region 230, and the second cladding layer 240, and evaporating 540 an electroplated (or otherwise-deposited) metal layer 270 adjacent the insulator layer 260, wherein the metal contact layer 270 is dimensioned and configured to laterally spread heat away from the semiconductor active region 230. The method further comprises forming 550 a bonding layer 290 adjacent to the substrate 210, forming 560 a heat sink 295 adjacent to the bonding layer 290, and evaporating 570 a metal layer 280 in between the substrate 210 and the heat sink 295.

Essentially, according to the invention when IC laser devices are covered with an approximately 3 μm thick Au layer 270 above an electrical contact layer (not shown), lateral heat flow is enhanced and device thermal resistances are reduced by an average of approximately 25 K/W or 40% (1 mm long devices). The thickness of the Au layer 270 is at least half of the thickness of the active region 230. Additionally, improved device performances are achieved including cw 80 K power conversion efficiency of 23%, cw differential external quantum efficiency of 532%, and cw lasing up to 214K.

In other words, to improve the thermal coupling between the active region 230 of an epi-side up ridge waveguide laser and the heat sink 295, thick electroplated gold 270, or other metal, is placed in contact with the exposed side and top surfaces of the etched ridge mesa 250. A thin dielectric layer 260 is used to electrically insulate the mesa sidewalls from the metal 270, and prevent a short circuit through the doped substrate 210 between the top and bottom metal contacts 270, 280, respectively. The thick metal layer 270 acts as a high thermal conductivity material surrounding the ridge mesa that improves the overall heat transfer out of the structure 200. Furthermore, the electroplated metal 270 is made to cover a large area allowing the heat generated within the narrow mesa 250 to spread over a larger portion of the substrate 210 at the level of the mesa device. This is an improvement over the typical epi-side up laser process that relies only on vertical heat conduction through the bottom cladding layer 120, passing into the substrate 110 through the small area defined by the mesa width. Additionally, the invention enables an increased laser operating temperature for the epi-side up process, which is favored from the manufacturing point of view.

The thermal resistance of any object is inversely proportional to its cross sectional area. Thus, if heat were forced to get to the heat sink only through the bottom of the narrow mesa region, as in the conventional devices, the effective area through which it must pass is the mesa surface area (cavity length×width). However, by allowing heat to extend beyond the mesa, as the invention provides, the heat can then conduct down through the substrate emanating from a larger effective area (reducing the resistance), thereby effectively working as if the mesa region were wider.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. For example, the invention may apply to any type of diode laser or in an optical pump embodiment. It is to be understood that the phraseology or terminology employed herein is for the purpose of description and not of limitation. Therefore, while the invention has been described in terms of preferred embodiments, those skilled in the art will recognize that the invention can be practiced with modification within the spirit and scope of the appended claims.

REFERENCES

[1] Faist, J. et al., Science, 264 (1994) 553.
[2] Lin, C. H. et al., Electron. Lett. 33 (1997) 598.
[3] IEEE J. Quantum Electron, 38(6) (2002) 509.
[4] Vurgaftman, J. R. et al., IEEE Photo. Tech. Lett., 9 (1997) 170, and references cited therein.
[5] Yang, R. Q. et al., Appl. Phys. Lett., 81 (2002) 397.
[6] Faist, J. et al., Appl. Phys. Lett., 67 (1995) 3057.
[7] Borca-Tasciuc, T. et al., Proceedings of International Conference on Heat Transfer and Transport 45 Phenomena in Microscale, Banff, Canada, Vol. 369, Oct. 15-20, 2000; Maycock, P. D., Solid State Electron, 10 (1964) 161; Landoldt-Borstein, Semiconductors, Vol. 17, Springer, New 49 York, 1982.
[8] Bruno, J. D., et al., Proc. SPIE 4287 (2001)1.

What is claimed is:

1. A method of manufacturing a semiconductor laser device comprising:
   depositing a first cladding layer over a substrate;
   depositing an active region on said first cladding layer;
   depositing a second cladding layer on said active region;
   removing a portion of each of said first cladding layer, said active region and said second cladding layer to form a mesa region having a top portion and a side portion, such that all of said first cladding layer that extends beyond said active region and said second cladding layer of said mesa region is removed to thereby enhance heat dissipation capability through the substrate;
   depositing an insulator layer on the side portion of said mesa region; and
   depositing a metal layer to cover the top portion of said mesa region and said insulator layer which is dimensioned and configured to have a thickness at least half a thickness of said mesa region and to laterally spread heat away from said active region.

2. The method of claim 1, wherein the step of removing a portion of each of said first cladding layer, said active region and said second cladding layer comprises an etching process.

3. The method of claim 1, wherein the step of depositing a metal layer comprises:
   evaporating a thin metal contact layer over said insulating layer; and
   applying a thicker electroplated metal layer upon the thin metal contact layer.

4. The method of claim 3, further including the steps of:
   evaporating a metal contact layer onto an underside of the substrate; and
   applying a bonding layer to the metal contact layer.

5. The method of claim 4, further including the steps of:
   applying a heat sink to the bonding layer; and
   attaching wire connectors to the metal contact layer.

6. The method of claim 3, wherein:
   the first cladding layer is InAs/AlSb;
   the second cladding layer is InAs/AlSb;
   the thin metal contact layer is Au/Ti; and
   the thicker electroplated layer is gold.

7. The method of claim 1, wherein:
   the step of depositing an insulator layer includes applying said insulator layer on the top portion of said mesa region.

8. The method of claim 1, wherein the step of removing a portion of each of said first cladding layer, said active region and said second cladding layer transgresses the entire thickness of said first cladding layer, said active region, and said second cladding layer.

* * * * *